United States Patent [19]
Zechman

[11] Patent Number: 5,824,568
[45] Date of Patent: *Oct. 20, 1998

[54] PROCESS OF MAKING AN INTEGRATED CIRCUIT CHIP COMPOSITE

[75] Inventor: John Harold Zechman, Endicott, N.Y.

[73] Assignee: International Business Machines Corporation, Armonk, N.Y.

[*] Notice: The term of this patent shall not extend beyond the expiration date of Pat. No. 5,622,898.

[21] Appl. No.: 675,822

[22] Filed: Jul. 5, 1996

Related U.S. Application Data

[60] Continuation of Ser. No. 445,381, May 19, 1995, Pat. No. 5,622,898, which is a division of Ser. No. 988,849, Dec. 10, 1992, Pat. No. 5,656,830.

[51] Int. Cl.⁶ .................................................. H01L 21/28
[52] U.S. Cl. .......................................... 438/112; 438/124
[58] Field of Search ................................... 437/211, 219; 29/855; 438/112, 121, 124

[56] References Cited

U.S. PATENT DOCUMENTS

| | | | |
|---|---|---|---|
| 3,331,125 | 7/1967 | McCusker | 29/578 |
| 3,449,641 | 6/1969 | Lee | 317/234 |
| 3,566,208 | 2/1971 | Wang | 317/234 |
| 3,826,244 | 7/1974 | Saleman et al. | |
| 4,005,472 | 1/1977 | Harris et al. | 357/71 |
| 4,173,664 | 11/1979 | Cioloszyk | |
| 4,323,914 | 4/1982 | Berndlmaier et al. | 357/82 |
| 4,401,053 | 8/1983 | Riley | |
| 4,486,945 | 12/1984 | Aigoo | 29/588 |
| 4,581,291 | 4/1986 | Bongianni | 428/381 |
| 4,945,856 | 8/1990 | Stewart | |
| 5,016,084 | 5/1991 | Nakao | 437/211 |
| 5,045,151 | 9/1991 | Edell | 437/68 |
| 5,323,533 | 6/1994 | Val | 437/211 |
| 5,404,265 | 4/1995 | Moresco et al. | 361/306.1 |
| 5,622,898 | 4/1997 | Zechman | 438/127 |

FOREIGN PATENT DOCUMENTS

| | | |
|---|---|---|
| 5-705 9343 | 4/1982 | Japan |
| 3-171 655 | 7/1991 | Japan |
| WO 90/02604 | of 1990 | WIPO |
| WO 92/17905 | of 1992 | WIPO |

OTHER PUBLICATIONS

Whittington et al, "Internal Conformal Coatings for Microcircuits", IEEE Transactions on Components, Hybrids, Manufacturing Technology, vol. CHMT–1, No. 4, pp. 416–422, Dec. 1978.

IBM Technical Disclosure Bulletin, vol. 34, No. 2 (1991) Module Protection, C4 Life Extension and Chip Reworkability Using Parylene.

IBM Technical Disclosure Bulletin, vol. 20, No. 11B (1978) Electronic Packaging Structure.

IBM Technical Disclosure Bulletin, vol. 15, No. 6 (1972) Packaging of Integrated Circuits.

Noriaki, Package of Semiconductor Integrated Circuit Device, Abstract of Japan, vol. 013, No. 594 (1989) and JP–A–01 248 547 (NEC Corp) (1989).

Sukeyuki, Bonding Wire for Semiconductor Device, Abstract of Japan, vol. 015, No. 442 (1989) and JP–A–03 185 742 (NEC Corp) (1991).

(List continued on next page.)

*Primary Examiner*—John Niebling
*Assistant Examiner*—Thomas G. Bilodeau
*Attorney, Agent, or Firm*—Pollock, Vande Sande & Priddy

[57] ABSTRACT

A composite containing an integrated circuit chip having conductive site thereon and electrically conductive leads that are interconnected to the conductive site by electrically conductive wire; wherein the wire is coated with a dielectric material. Also, a method for fabricating the composite is provided.

12 Claims, 1 Drawing Sheet

OTHER PUBLICATIONS

Shunpei et al., Manufacture of Electronic Device, Abstract of Japan, vol. 014, No. 079 (1990) and JP–A–01–292 849 (Semiconductor Energy Lab Co Ltd) (1989).

Takayuki, Semiconductor Device, Abstract of Japan, vol. 014, No. 065 (1990) and JP–A–01–283 855 (NEC Corp) (1989).

Shunpei et al., Lead Frame and Manufacture of Electronic Device Incorporating the Same, Abstract of Japan, vol. 014, No. 229 (1990) and JP–A 02 060 154 (Semiconductor Energy Lab Co Ltd) (1990).

Michio et al., Semiconductor Device and Manufacture Thereof, Abstract of Japan, vol. 013, No. 578 (1989) and JP–A–01 243 441 (Hitachi Ltd) (1989).

Nova Tran Corporation Parylene Conformal Coatings Specifications and Properties, Sales Literature, 1991, pp. 1–11.

PROCESS OF MAKING AN INTEGRATED CIRCUIT CHIP COMPOSITE

This application is a continuation of U.S. patent application Ser. No. 08/445,381, filed May 19, 1995, now U.S. Pat. No. 5,622,898 which in turn is a divisional application of U.S. patent application Ser. No. 07/988,849 filed Dec. 10, 1992, now U.S. Pat. No. 5,656,830.

DESCRIPTION

1. Technical Field

The present invention is concerned with an integrated circuit chip package and especially to providing improved interconnection between electrically conductive sites thereon and electrically conductive leads. In addition, the present invention is concerned with a method for fabricating such a composite.

2. Background Art

In the fabrication of what is referred to as plastic flat pack packages, the electrically conductive sites or pads on an integrated circuit chip are connected to the electrically conductive leads by using a relatively thin wire, typically a gold wire. During molding to encapsulate the composite with a dielectric material, there is a tendency to cause distortion of the wires, thereby resulting in short circuiting. In order to avoid this short circuiting, relatively short wires (e.g. 3–4 mm) that are drawn very tightly between the integrated circuit chip and conductive leads are typically employed. However, the need for short length wires drawn tightly requires relatively high tolerances, which thereby significantly increases the complexity of fabricating the package.

SUMMARY OF INVENTION

It is therefore an object of the present invention to provide a technique that allows distortion of the wire during molding while preventing short circuiting. It is a further object of the present invention to make it possible to fabricate electronic packages without requiring the high tolerances associated with relatively short length wires drawn tightly as currently required.

It has been found pursuant to the present invention that coating the wire with a conformable dielectric material, the problem caused by distortion during molding is eliminated. More particularly, the present invention is concerned with a composite that comprises an integrated circuit chip having electrically conductive site thereon; an electrically conductive lead; and electrically conductive wire interconnecting the conductive site and electrically conductive lead. The wire includes a conformal coating of a dielectric thereon.

The present invention is also concerned with a method for fabricating the composite which includes providing an integrated circuit chip having electrically conductive site thereon. A conductive lead is connected to the conductive site on the integrated circuit chip with an electrically conductive wire. A dielectric material is then conformably coated onto the wire. Then, the chip, wire and portion of conductive lead is encapsulated in a dielectric material.

BEST AND VARIOUS MODES FOR CARRYING OUT INVENTION

Figure 1:
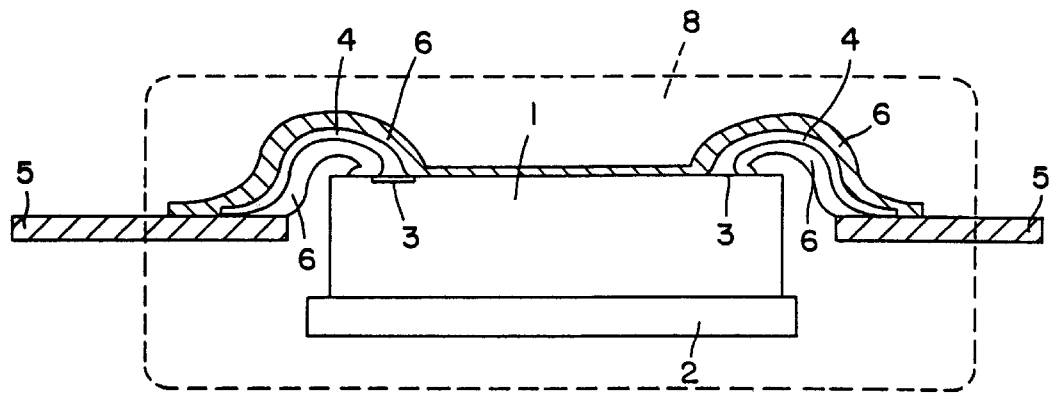
FIG. 1 is a schematic diagram of a composite pursuant to the present invention.

Reference is made to the figures in order to facilitate an understanding of the present invention. Like numerals in different figures refer to the same or equivalent element. In particular, FIG. 1 illustrates a composite pursuant to the present invention wherein chip 1 is located on a chip carrier or pedestal 2. The integrated circuit chip is preferably of silicon. The chip carrier is typically fabricated from an electrically conductive material such as copper. It is used to create a rigid mechanical system for chip/lead processing prior to molding. Of course, other types of chip carriers could be used, if desired. The chip includes electrically conductive sites 3 which are typically aluminum, gold and solder. Connected to each conductive site 3 are electrically conductive wires 4. The wires are typically about 0.0005 to about 0.003 and more typically about 0.001 to about 0.003 inches thick. Also, the wires are typically at least about 3 mm long, more typically about 5 mm long and preferably about 5 mm to about 8 mm long. Examples of suitable wires are aluminum and gold and more typically gold. More particularly, the wire typically includes a ball like configuration at the end that is to contact the conductive site. The wire is attached to the conductive site 3 through normal wire bonding techniques using usual bonding tools. In a preferred embodiment, the balled end of a gold wire is contacted with an aluminum site 3 and upon the heating a eutectic is formed that unites the aluminum site with the gold wire.

Typically, the bonding tool employed attaches the wire's other end to electrically conductive leads 5 such as gold-coated copper leads. Although not shown in the figure, each lead 5 will have a wire connecting it to a conductive site 3. The wire 4 is connected by heating to typical wire bonding temperatures.

A dielectric coating 6 is then applied to wires 4. It is important to the success of the present invention that the wires are coated with dielectric coating 6 after connection has been made between the conductive site and leads via the wire. The coating 6 is typically about 0.0001 to about 0.001 inches thick and more typically about 0.0001 to about 0.0003. The coating also typically extends over the chip 1, and ends of copper leads 5. The coating must be conformable, an example being a parylene coating. Parylene polymers are obtainable from Union Carbide Corp. Suitable parylene coatings including parylene N, parylene C and parylene D. These polymers are represented by the following structural formulas.

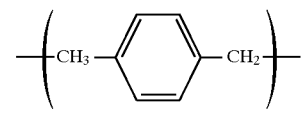

Parylene N

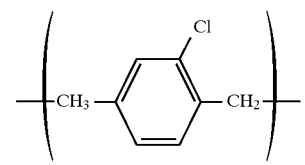

Parylene C

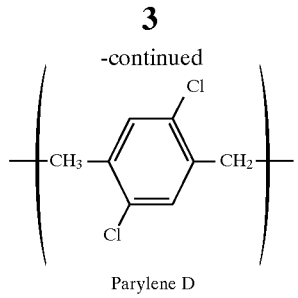

Parylene D

These polymers typically have molecular weights of about 500,000. A discussion of these polymers can be found in the publication entitled "Novatran Corp. Parylene Conformal Coatings Specifications and Properties, P/N 400-0001-00" by Novatran Corp., the disclosure of which is incorporated herein by reference. The preferred parylene coating employed pursuant to the present invention is parylene N.

Parylene is commercially available as a dimer. Parylene N is referred to as polyparaxylylene. Parylene C is referred to as monochloropolyparaxylylene and parylene D is dichloropolyparaxylylene.

The coating is typically applied by a vapor deposition method. Coating apparatus such as that disclosed in "Novatran Corp. Parylene Conformal Coatings Specifications and Properties, P/N 400-0001-00"; U.S. Pat. Nos. 4,401,053, 4,945,856 and WO90/02604 can be employed. A detailed discussion of the apparatus for carrying out the deposition is not necessary since such can be carried out by those skilled in the art without undue experimentation. In a typical arrangement, the apparatus includes a vaporizing chamber, pyrolizing chamber and deposition chamber. The parylene dimer is first vaporized at a temperature of about 150° C. and pressure of about 1 Torr. Next, the dimer is pyrolyzed at the two methylene-methylene bonds at about 680° C. and about 0.5 Torr to yield a stable monomeric diradical, such as p-xylylene. Next, the monomer enters the deposition chamber which is at about room temperature and about 0.1 torr where it is absorbed and polymerized on the wire.

The dielectric constant of the parylene coating is typically about 3.

The composite also includes support fingers that lead from the chip support 2. These support fingers are typically constructed of copper.

Next, the composite is placed in a mold into which is placed a dielectric encapsulating composition 8 such as an epoxy composition. Typical suitable encapsulants are disclosed in U.S. Pat. Nos. 4,235,620; 4,592,944, and 4,818,812, disclosures of which are incorporated herein by reference. The dielectric coating 6 precludes short circuiting due to movement of the wires during this encapsulation process.

Figure 2:
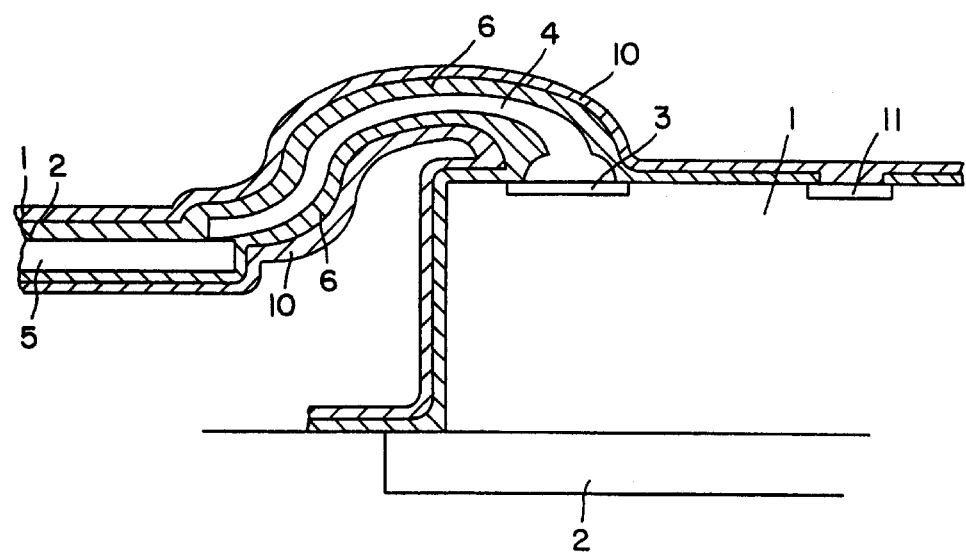
FIG. 2 is a schematic diagram of an alternative composite pursuant to the present invention.

Reference to FIG. 2 illustrates an alternative embodiment of the present invention that further includes an electrically conductive coating 10 surrounding the dielectric coating 6. Preferably, the conductive coating is aluminum and is typically about 0.0005 to about 0.002 inches thick. Other electrically conductive materials including polymeric compositions such as epoxides containing electrically conductive particles can be used. This coating 10 provides for a ground that can be coupled to the chip. It is advantageous since it reduces lead inductance and gives greater package speeds. It also provides for reduced electrical noise. In the alternative, ground can be provided by providing vias through the dielectric coating 6 to conducter 5, which in turn is electrically connected to a conductive pad 11. The vias can be formed by providing a suitable mask during the vapor deposition of the dielectric coating 6.

The vias are filled with the electrically conductive material 10.

In a further alternative embodiment, conducter 5 is composed of a dielectric substrate such as a ceramic having electrical conductors thereon.

What is claimed is:

1. A method for fabricating a composite which comprises providing an integrated circuit chip having electrically conductive site thereon; interconnecting conductive lead to said conductive site with electrically conductive wire wherein said wire is at least 5 mm long; then conformally coating said wire with a dielectric material wherein said dielectric is parylene; and then encapsulating the chip, wire and portion of said conductive lead in a dielectric encapsulating composition.

2. The method of claim 1 wherein said electrically conductive site is aluminum.

3. The method of claim 1 wherein said conductive lead is copper.

4. The method of claim 1 wherein said conductive lead is gold-plated copper.

5. The method of claim 1 wherein said dielectric material is parylene N.

6. The method of claim 1 wherein the dielectric material is about 0.0001 to about 0.0003 inches thick.

7. The method of claim 1 wherein parylene is coated on said wire by vapor deposition.

8. The method of claim 1 wherein said dielectric material is about 0.0001 to about 0.001 inches thick.

9. The method of claim 1 wherein said wire is 0.0005 to about 0.003 inches thick.

10. The method of claim 1 wherein said wire is gold wire.

11. The method of claim 1 wherein said encapsulating composition is an epoxy composition.

12. The method of claim 1 wherein said composite is a plastic flat-pack package.

* * * * *